(12) United States Patent
Huh et al.

(10) Patent No.: US 7,764,327 B2
(45) Date of Patent: Jul. 27, 2010

(54) DISPLAY DEVICE

(75) Inventors: Jong-moo Huh, Hwaseong (KR); Joon-hoo Choi, Seoul (KR); Seung-kyu Park, Hwaseong (KR)

(73) Assignee: Samsung Electronics Co., Ltd. (KR)

( * ) Notice: Subject to any disclaimer, the term of this patent is extended or adjusted under 35 U.S.C. 154(b) by 618 days.

(21) Appl. No.: 11/676,011

(22) Filed: Feb. 16, 2007

(65) Prior Publication Data

US 2007/0195248 A1 Aug. 23, 2007

(30) Foreign Application Priority Data

Feb. 16, 2006 (KR) .................. 10-2006-0015091

(51) Int. Cl.
*G02F 1/136* (2006.01)
*G02F 1/1335* (2006.01)
*G02F 1/1333* (2006.01)

(52) U.S. Cl. .................. 349/42; 349/43; 349/48; 349/57; 349/92

(58) Field of Classification Search ............ 349/43, 349/48, 57, 92; 345/92; 257/57
See application file for complete search history.

(56) References Cited

U.S. PATENT DOCUMENTS 4,930,874 A * 6/1990 Mitsumune et al. ........... 349/48
5,151,689 A * 9/1992 Kabuto et al. ............... 345/103
6,225,750 B1 * 5/2001 Kimura ..................... 315/169.3
7,199,808 B2 * 4/2007 Yo .............................. 345/694
2004/0222746 A1 11/2004 Winters
2006/0186822 A1 * 8/2006 Park ......................... 315/169.3
2007/0029941 A1 * 2/2007 Ito et al. ................... 315/169.3
2007/0111407 A1 * 5/2007 Sun ............................. 438/149
2008/0165302 A1 * 7/2008 Yasui et al. ................... 349/48

FOREIGN PATENT DOCUMENTS

| JP | 2003108070 | 4/2003 |
|---|---|---|
| KR | 1020050050001 | 5/2005 |

* cited by examiner

*Primary Examiner*—Uyen-Chau N Le
*Assistant Examiner*—Chris H Chu
(74) *Attorney, Agent, or Firm*—Cantor Colburn LLP

(57) ABSTRACT

A display device includes a first switching transistor, a first driving transistor connected to the first switching transistor, a second switching transistor including an input terminal connected to an output terminal of the first switching transistor, a second driving transistor connected to the second switching transistor, and a pixel unit comprising a sub-pixel electrode connected to the first driving transistor and a main pixel electrode separated from the sub-pixel electrode and connected to the second driving transistor.

19 Claims, 9 Drawing Sheets

DISPLAY DEVICE

This application claims priority to Korean Patent Application No. 2006-0015091, filed on Feb. 16, 2006, and all the benefits accruing therefrom under 35 U.S.C. §119, the contents of which in its entirety are herein incorporated by reference.

BACKGROUND OF THE INVENTION (a) Field of the Invention

The present invention relates to a display device, and more particularly, to a display device which employs thin film transistors.

(b) Description of the Related Art

Flat display devices have become increasingly popular in the display device industry because of their small size and light weight. Flat display devices include liquid crystal displays ("LCDs") and organic light emitting diode ("OLED") displays among several other types.

The LCD and the OLED display both comprise thin film transistors ("TFTs") to display images. A TFT comprises a semiconductor layer, a gate electrode, a source electrode, a drain electrode and various other components. The semiconductor layer has a channel though which an electric current flows. The gate electrode produces an electric field in the channel to control, by turning on or off, the flow of the electric current when a signal is applied to the gate electrode. The source electrode and the drain electrode transmit a signal to pixels according to the on/off control by the gate electrode.

The semiconductor layer may be made of amorphous silicon. Unfortunately amorphous silicon has poor electrical characteristics and low reliability because of its low field-effect mobility and thus is unsuitable for a large-sized display device.

To overcome this problem, a TFT employing poly silicon having mobility of about 20 $cm^3$/Vsec to about 150 $cm^3$/Vsec as a semiconductor layer has been developed. The poly silicon TFT has relatively high field-effect mobility, and thus it is easy to implement a chip on glass ("COG") method in which a driving circuit is directly mounted on a substrate.

On the other hand, a greater amount of leakage current is generated in a TFT employing poly silicon than in a TFT employing amorphous silicon. Leakage current occurs when the gate electrode is turned off and yet a current is still able to flow through the TFT. This unwanted characteristic of poly silicon TFTs induces cross-talk between pixels.

In order to enhance the electric characteristics of the semiconductor layer and minimize the occurrence of cross-talk, a TFT may employ a lightly doped drain ("LDD") structure in which a semiconductor layer is divided into three regions: a region with substantially no ion doping, a region into which ions are heavily doped and a region into which ions are lightly doped. However, a semiconductor layer utilizing the LDD structure is more complicated to manufacture as it requires two ion-doping processes, namely a light ion-doping process and a heavy ion-doping process.

BRIEF SUMMARY OF THE INVENTION

Accordingly, it is an aspect of the present invention to provide a display device in which leakage current decreases to prevent cross-talk.

A display device includes; a first switching transistor, a first driving transistor connected to the first switching transistor, a second switching transistor including an input terminal connected to an output terminal of the first switching transistor, a second driving transistor connected to the second switching transistor, and a pixel unit comprising a sub-pixel electrode connected to the first driving transistor and a main pixel electrode separated from the sub-pixel electrode and connected to the second driving transistor.

In one exemplary embodiment the display device further includes a sub-storage electrode which maintains a voltage applied to the sub-pixel electrode and a main storage electrode which maintains a voltage applied to the main pixel electrode.

In one exemplary embodiment a capacitance of the sub-storage electrode differs from a capacitance of the main storage electrode.

In one exemplary embodiment the capacitance of the sub-storage electrode is greater than the capacitance of the main storage electrode.

In one exemplary embodiment the area of the sub-pixel electrode differs from the area of the main pixel electrode.

In one exemplary embodiment the area of the sub-pixel electrode is smaller than the area of the main pixel electrode.

In one exemplary embodiment the display device further includes a light-emitting layer formed on the sub-pixel electrode and the main pixel electrode, wherein the light-emitting layer emits light of a single color.

In one exemplary embodiment the pixel unit comprises a plurality of pixel units and the area of the plurality of pixel units varies.

In one exemplary embodiment the display device further includes; a power supply line which applies a driving voltage to the first and second driving transistors, and a power supply electrode branching from the power supply line, wherein the power supply electrode includes a first portion connected to the input terminal of the first driving transistor and a second portion connected to the input terminal of the second driving transistor.

In one exemplary embodiment the sub-pixel electrode is disposed substantially opposite to the main pixel electrode with respect to a gate line.

In one exemplary embodiment the switching transistors include semiconductor layers including one of amorphous silicon, microsilicon and polysilicon and the driving transistors include semiconductor layers including of one of amorphous silicon, microsilicon and polysilicon.

In one exemplary embodiment the switching transistors include semiconductor layers including amorphous silicon, and the driving transistors include semiconductor layers made of one of microsilicon and polysilicon.

In one exemplary embodiment semiconductor layers of the switching transistors and the driving transistors include polysilicon, and the switching transistors and the driving transistors are top-gate type transistors.

In one exemplary embodiment the display device further includes a color filter layer corresponding to the pixel unit.

In one exemplary embodiment semiconductor layers of the first and second switching transistors are disposed further from an insulating substrate than semiconductor layers of the first and second driving transistors.

A display device includes; a data line, a first switching transistor and a second switching transistor connected to the data line in series, a first driving transistor connected to the first switching transistor, a second driving transistor connected to the second switching transistor, a first sub-pixel connected to the first driving transistor, and a second sub-pixel separated from the first sub-pixel and connected to the second driving transistor.

In one exemplary embodiment the first and the second driving transistors include semiconductor layers including polysilicon.

In one exemplary embodiment the first and second switching transistors comprise semiconductor layers comprising amorphous silicon.

A method of manufacturing a display device includes; forming a first switching transistor, forming a first driving transistor connected to the first switching transistor, forming a second switching transistor including an input terminal connected to an output terminal of the first switching transistor, forming a second driving transistor connected to the second switching transistor, and forming a pixel unit including a sub-pixel electrode connected to the first driving transistor and a main pixel electrode separated from the sub-pixel electrode and connected to the second driving transistor.

BRIEF DESCRIPTION OF THE DRAWINGS

The above and/or other aspects, features and advantages of the present invention will become apparent and more readily appreciated from the following description of the exemplary embodiments, taken in conjunction with the accompanying drawings, in which.

DETAILED DESCRIPTION OF THE INVENTION

Figure 1:
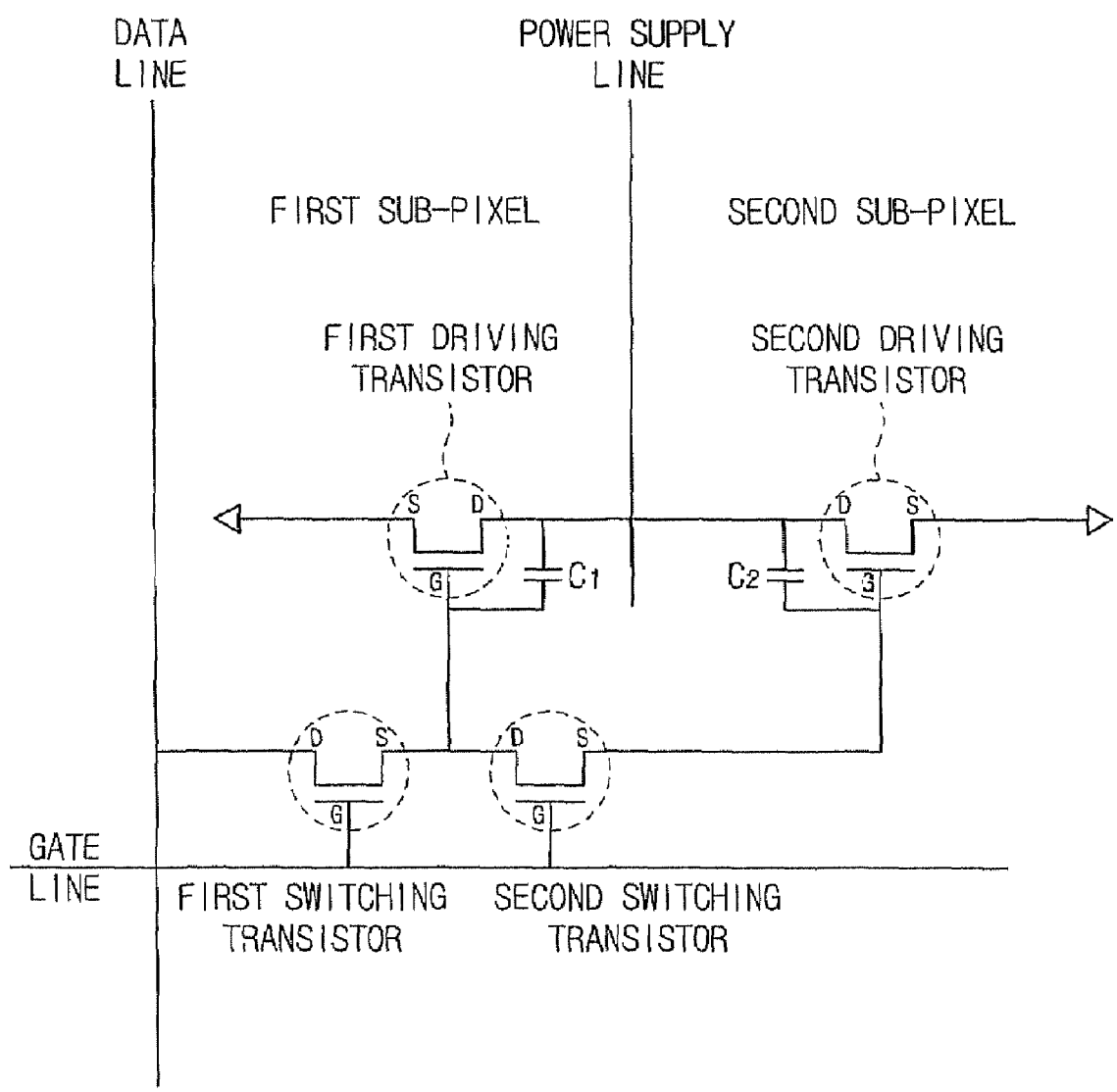
FIG. 1 is an equivalent circuit diagram of an exemplary embodiment of a pixel in a first exemplary embodiment of a display device according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the-present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

FIG. 1 is an equivalent circuit diagram of an exemplary embodiment of a pixel in a first exemplary embodiment of a display device according to the present invention. As shown in FIG. 1, a single pixel comprises first and second sub-pixels each having a switching transistor and a driving transistor. A display device comprises a gate line, a data line and a power supply line which apply electric signals to the transistors. In this exemplary embodiment, an organic light emitting diode ("OLED") display device will be described as an example. In an OLED display light is emitted from an organic light-emitting layer when a driving voltage is applied to the OLED through the transistors. The transistors may be thin film transistors ("TFTs").

A first switching transistor is formed at an intersection of the data line and the gate line. A source electrode of the first switching transistor functions as an output terminal and is connected to a first driving transistor and a second switching transistor. The second switching transistor is connected to a second driving transistor. The first and second driving transistors are connected to sub-pixel electrodes. The connections from the driving transistors function as anodes, respectively. Drain electrodes of the driving transistors are connected to the power supply line which applies the driving voltage.

The first and second sub-pixels comprise capacitors C1 and C2 to maintain a pixel voltage for each pixel, respectively. Storage electrodes for the capacitors C1 and C2 are formed between gate electrodes and drain electrodes of the first and second driving transistors, respectively. The capacitances of the capacitors C1 and C2 vary depending on the area of the storage electrodes. Additionally, the capacitances of the first and second sub-pixels may be the same as or different from each other.

The first switching transistor and the second switching transistor are connected to the data line in series. That is, the output terminal of the first switching transistor is connected to an input terminal of the second switching transistor. A data voltage provided through the first switching transistor drives the first sub-pixel along with a driving voltage provided to the first driving transistor. The data voltage provided to the second switching transistor through the first switching transistor drives the second sub-pixel along with a driving voltage provided to the second driving transistor.

Although the single pixel is divided into the two sub-pixels, each sub-pixel is applied with the same data voltage and the same driving voltage. As compared with a conventional pixel, the exemplary embodiment of a pixel according to the present invention comprises two or more switching transistors and the switching transistors are connected with each other in series, and thus the second switching transistor is applied with the data voltage through the first switching transistor, which is applied with the data voltage directly from the data line. The size of the sub-pixels may vary similar to the capacitance, as necessary.

If a leakage current Ioff flowing in semiconductor layers of the switching transistors is large when a gate-off voltage is applied to the switching transistors, a pixel voltage charged in a pixel electrode may be influenced by variation of a different data voltage applied to an adjacent pixel. Accordingly, a cross-talk may be generated which may change the brightness and pattern of an image. The cross-talk phenomenon becomes even more of a problem when the semiconductor layer is made of poly silicon.

To prevent cross-talk from being generated, the display device of the present invention comprises a plurality of switching transistors which are connected with each other in series. The data voltage applied from the first switching transistor is accumulated in the second sub-pixel connected to the first sub-pixel in series, and thus influence of the leakage current which may be generated when the gate electrode is turned off is effectively prevented or absorbed in the first sub-pixel. That is, the capacitance of the capacitor C1 of the first sub-pixel connected to the data line buffers an effect of signal variation due to the leakage current Ioff, and accordingly, the magnitude of variation of the pixel voltage accumulated in the second sub-pixel decreases, thereby allowing the display device to emit light more stably.

In one exemplary embodiment the capacitance of the first sub-pixel serving as a buffer may be larger than the capacitance of the second sub-pixel to further decrease the variation of the pixel voltage by the leakage current Ioff, and the area of the pixel electrode of the second sub-pixel, which influences the amount of light emitted by the second sub-pixel, may be larger than the area of the pixel electrode of the first sub-pixel. However, the capacitances and the areas of the pixel electrodes of the sub-pixels are not particularly limited, but may be varied in various ways.

Moreover, exemplary embodiments of the display device of the present invention do not require an additional process to form a lightly doped drain ("LDD"), as in a comparison display device which prevent cross-talk, since there is no need to form the LDD for decrease of the leakage current Ioff even though exemplary embodiments of the display device may employ a poly silicon semiconductor layer.

Additionally, since a pixel comprises a plurality of sub-pixels, a pixel defect rate decreases. Pixel defects manifest themselves in a variety of ways, one of which is when a transistor to be turned on is turned off or a transistor to be turned off is turned on. Thus, if a transistor in a pixel is defective, users can easily recognize the defective pixel in the display device. However, when a single pixel comprises a plurality of sub-pixels, even if one of the sub-pixels is defective, another sub-pixel may be normally driven, thereby allowing the pixel as a whole to be normally driven.

The number of sub-pixels included in a pixel is not limited to two as in the current exemplary embodiment. Exemplary embodiments include configurations wherein the pixel may further comprise one or more third switching transistors connected to the second switching transistor in series, or an additional third switching transistor may be connected to the output terminal of the first switching transistor. Alternative exemplary embodiments include configurations wherein the pixel may comprise a plurality of first switching transistors connected to the data line and a second switching transistor and a third switching transistor connected to each of the first switching transistors. If each sub-pixel comprises a switching transistor, a driving transistor, a pixel electrode and a capacitor, and each pixel comprises at least one sub-pixel having a switching transistor connected to another switching transistor in series, the location and number of transistors may be varied in various ways.

Moreover, exemplary embodiments of the semiconductor layer may be made of amorphous silicon or micro-silicon, and the present invention is not limited to poly silicon as shown in the present exemplary embodiment.

Figure 2:
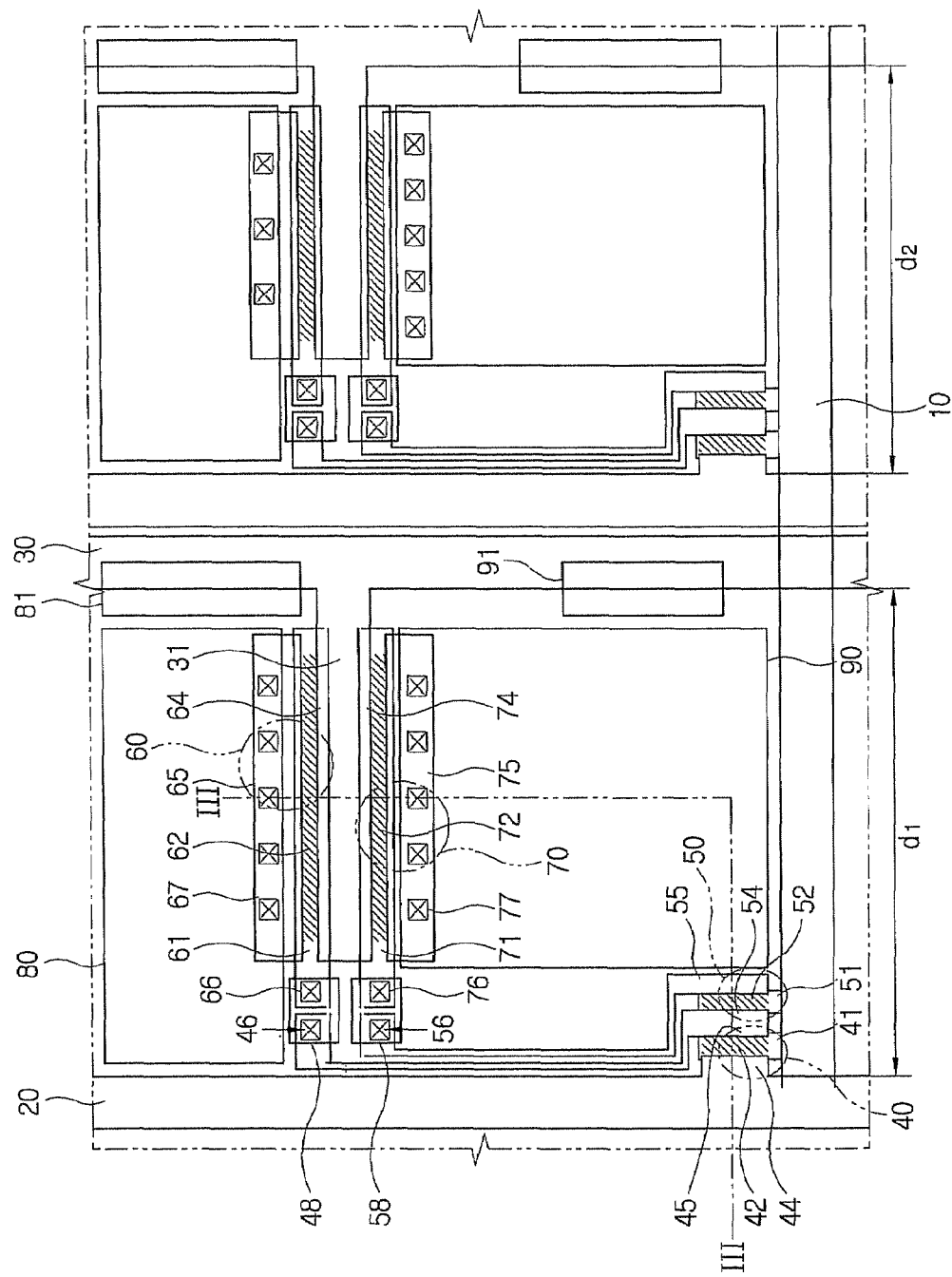
FIG. 2 is a top plan schematic view of the first exemplary embodiment of a display device according to the present invention.
Figure 3:
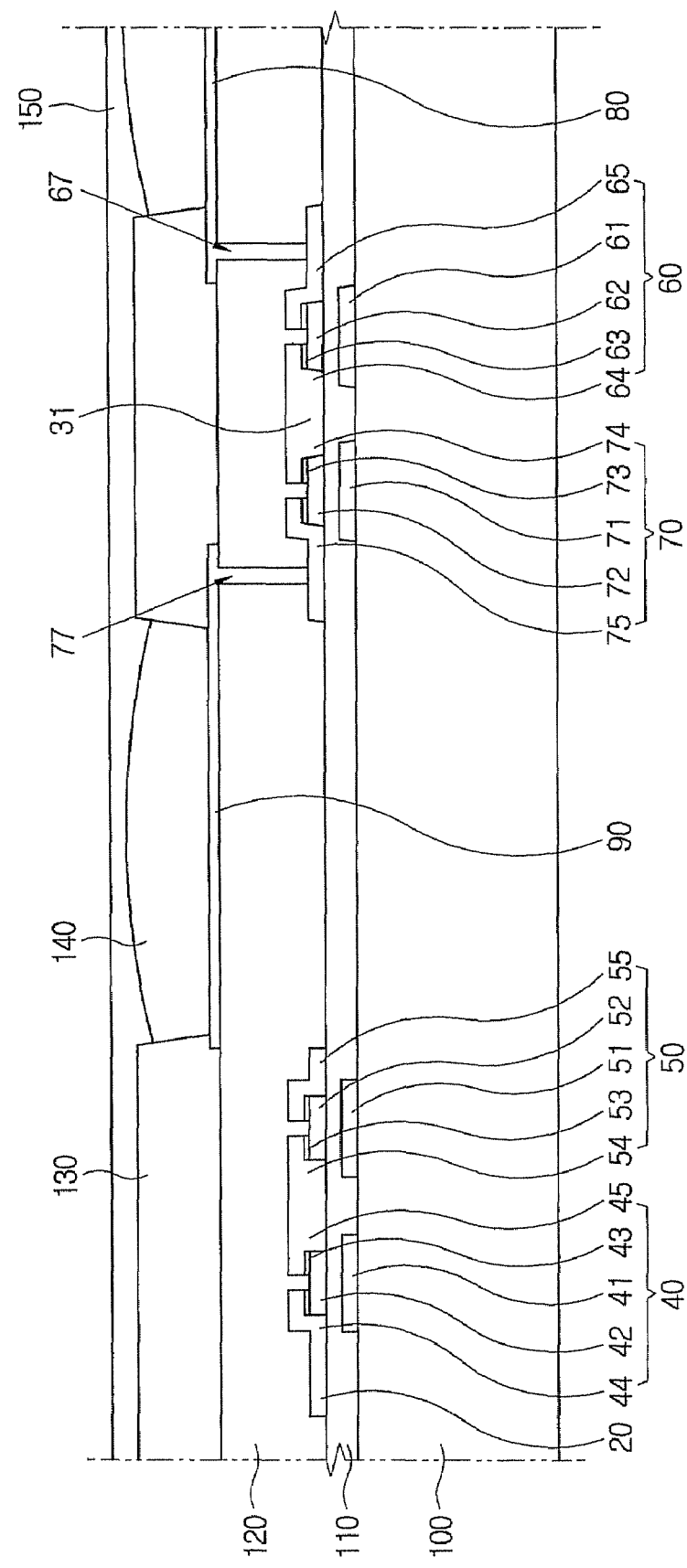
FIG. 3 is a cross-sectional view taken along line III-III in FIG. 2.

FIG. 2 is a top plan schematic view of the first exemplary embodiment of a display device according to the present invention. FIG. 2 illustrates a pixel which utilizes the equivalent circuit shown in FIG. 1. FIG. 3 is a cross-sectional view taken along line III-III in FIG. 2.

Referring to FIG. 2, the display device comprises a gate line 10, and a data line 20 and a power supply line 30 which are disposed substantially perpendicular to the gate line 10. The data line 20 and the power supply line 30 are formed substantially in parallel to each other. The power supply line 30 comprises a power supply electrode 31 to provide a driving voltage to a first driving transistor 60 and a second driving transistor 70.

A first switching transistor 40 and a second switching transistor 50 are formed at the intersection of the data line 20 and the gate line 10 and are connected to each other in series. The first switching transistor 40 and the second switching transistor 50 are connected to the first driving transistor 60 and the second driving transistor 70, respectively.

The first driving transistor 60 and the second driving transistor 70 are connected to a sub-pixel electrode 80 and a main pixel electrode 90, respectively. A single pixel of a rectangular shape comprises two pixel electrodes, e.g., the sub-pixel electrode 80 and the main pixel electrode 90, the single pixel will be referred to as a pixel unit hereinafter.

As shown in FIG. 3, gate electrodes 41, 51, 61 and 71 of the transistors 40, 50, 60 and 70, respectively, are formed on an insulating substrate 100. In one exemplary embodiment the insulating substrate 100 may be made of transparent glass. The gate electrodes 41, 51, 61 and 71 are covered with a gate insulating layer 110.

The gate electrode 41 of the first switching transistor 40 and the gate electrode 51 of the second transistor 50 are extensions of a portion of the gate line 10.

Semiconductor layers 42, 52, 62 and 72, which in the present exemplary embodiment are made of poly-silicon, are formed on the gate insulating layer 110. Ohmic contact layers 43, 53, 63 and 73 are formed on the semiconductor layers 42, 52, 62 and 72 and divided into two parts across the semiconductor layers 42, 52, 62 and 72. In the present exemplary embodiment the ohmic contact layers 43, 53, 63 and 73 are made of n+ polysilicon and are highly doped with n-type impurities.

In the present exemplary embodiment the semiconductor layers 42, 52, 62 and 72 and the ohmic contact layers 43, 53, 63 and 73 are formed by patterning and crystallizing amorphous silicon. Exemplary embodiments of a crystallizing method include solid phase crystallization ("SPC"), excimer laser crystallization ("ELC"), rapid thermal annealing ("RTA") and various other techniques. In SPC, amorphous silicon is processed at a relatively low temperature below 600° C. for many hours to create polysilicon with large-sized grains. In ELC, polysilicon is created using excimer laser annealing ("ELA"), a sequential lateral solidification ("SLS") or other similar process. In RTA, polysilicon is created by depositing amorphous silicon at a low temperature and rapidly annealing the surface thereof with light.

Drain electrodes 44, 54, 64 and 74 and source electrodes 45, 55, 65 and 75 of the transistors 40, 50, 60 and 70, respectively, are formed on the gate insulating layer 110 and the ohmic contact layers 43, 53, 63 and 73. In the current exemplary embodiment the drain electrodes 44, 54, 64 and 74 and the source electrodes 45, 55, 65 and 75 are formed of substantially the same metal layer and are separated from each other across the gate electrodes 41, 51, 61 and 71.

In the present exemplary embodiment the source electrode 45 of the first switching transistor 40 and the drain electrode 54 of the second switching transistor 50 are formed in a single body. Thus, current flowing from the source electrode 45 of the first switching transistor 40 flows into the second switching transistor 50.

Contact holes 46, 56, 66 and 76 are formed on the source electrode 45 of the first switching transistor 40, the gate electrode 61 of the first driving transistor 60, the source electrode 55 of the second switching transistor 50 and the gate electrode 71 of the second driving transistor 70, respectively. Contact holes 46 and 66 are electrically connected to each other through a bridge electrode 48 and contact holes 56 and 76 are electrically connected to each other through a bridge electrode 58. The source electrodes 45 and 55 of the switching transistors 40 and 50 extend upward to connect to the gate electrodes 61 and 71, respectively.

The first driving transistor 60 and the second driving transistor 70 are disposed in the central area of the pixel along the gate line 10. The drain electrodes 64 and 74 of the driving transistors 60 and 70 are formed by portions of the power supply electrode 31 and are applied with a driving voltage from the power supply line 30. In other words, two driving transistors 60 and 70 share a single power supply electrode 31 as the drain electrodes 64 and 74. In the current exemplary embodiment the semiconductor layers 62 and 72 of the driving transistors 60 and 70 are made of polysilicon.

A passivation layer 120 is formed on the drain electrodes 44, 54, 64 and 74, the source electrodes 45, 55, 65 and 75 and portions of the transistors 40, 50, 60 and 70 which are not covered with the drain electrodes 44, 54, 64 and 74 and the source electrodes 45, 55, 65 and 75. Contact holes 67 and 77 are formed on the passivation layer 120 to expose the source electrodes 65 and 75 of the first and second driving transistors 60 and 70. In one exemplary embodiment the passivation layer 120 may be made of an inorganic material such as silicon nitride, or an organic material. In one exemplary embodiment the organic material may comprise one of a benzocyclobutene ("BCB") series, an olefin series, an acrylic resin series, a polyimide series, a Teflon™ series, Cytop™, and perfluorocyclobutene ("PFCB").

The sub-pixel electrode 80 and the main pixel electrode 90 are formed on the passivation layer 120. In one exemplary embodiment the sub-pixel electrode 80 and the main pixel electrode 90 may be made of a transparent conductive material such as indium tin oxide ("ITO") or indium zinc oxide ("IZO"). The pixel unit comprising the two sub-pixel electrodes 80 and 90, is also called an anode and provides holes to a light-emitting layer 140. The pixel unit 80 and 90 is connected to the source electrodes 65 and 75 through the contact holes 67 and 77 to receive a pixel voltage.

The sub-pixel electrode 80 is applied with a gate on/off voltage through the first switching transistor 40 directly connected to the data line 20. The sub-pixel electrode 80 has a smaller area than the main pixel electrode 90, thereby emitting less light than the sub-pixel electrode 90.

In the present exemplary embodiment, the pixel unit is divided into the sub-pixel electrode 80 and the main pixel electrode 90 as an example without any restriction on their functions.

In one exemplary embodiment storage electrodes 81 and 91 are formed from the same gate metal layer which formed the gate line 10. The storage electrodes 81 and 91 form capacitors together with the power supply line 30. The storage electrodes 81 and 91 maintain the pixel voltage provided to the sub-pixel electrode 80 and the main pixel electrode 90 during one frame. One frame is the time period in between gate on and gate off signals along a particular gate line. A series of frames may be shown in rapid succession to produce a moving image. The storage electrodes 81 and 91 may be classified as a sub-storage electrode 81 and a main storage electrode 91. in one exemplary embodiment the sub-storage electrode 81 has a larger area than the main storage electrode

91. Thus, the sub-pixel electrode 80 directly connected to the data line 20 may have a sufficient capacitance to minimize an influence by the leakage current.

In the present exemplary embodiment, the sub-pixel electrode 80 has the smaller area than the main pixel electrode 90, and the sub-storage electrode 81 has a larger area than the main storage electrode 91. However, alternative exemplary embodiments may have different areas without any limitation, as necessary.

A wall 130 is formed on the transistors 40, 50, 60 and 70 between the sub-pixel electrode 80 and the main pixel electrode 90. The wall 130 separates the sub-pixel electrode 80 from the main pixel electrode 90 and also separates one pixel from another. In one exemplary embodiment the wall 130 may be made of photoresist having thermal resistance and solvent-resistance, such as acrylic resin, polyimide resin or other similar material, or an inorganic material such as $SiO_2$ and $TiO_2$, and in an alternative exemplary embodiment may have a double-layered structure of an organic layer and an inorganic layer.

The light-emitting layer 140 is formed on a portion of the pixel unit 80 and 90 which is not covered with the wall 130. The light-emitting layer 140 may be made of polyfluorene derivatives, poly(p-phenylene vinylene) derivatives, polyphenylene derivatives, poly(N-vinylcarbazole) derivatives and poly thiophene derivatives or compounds thereof, which are doped with perillene group pigment, rhodamine, rubrene, perillene, 9,10-diphenylanthracene, tetraphenylbuta, tetraphenylbutadiene, nile red, cumarine 6, quinacridone, and other similar substances. In one exemplary embodiment the light-emitting layer 140 on the sub-pixel electrode 80 and the main pixel electrode 90 in the single pixel emits the same color light.

In the present invention, the single pixel has an area different from those of adjacent pixels. The pixel is provided in a plurality to sequentially emit red light, green light and blue light, and generally has a rectangular shape, but is not limited thereto.

As shown in FIG. 2, short sides of the pixels have different lengths d1 and d2. The area of the pixel is determined depending on various factors. The area of the pixel, and therefore the area of the light-emitting layer 140 may vary depending on a life-time, visibility or brightness of an organic layer thereof. In one exemplary embodiment, a pixel unit 80 and 90 formed below a red light-emitting layer 140 may have a larger size than pixel units 80 and 90 formed below green and blue light-emitting layers 104. In the present exemplary embodiment pixels emitting three primary colors may each have different sizes. Alternative exemplary embodiments include configurations wherein all pixels may have the same area.

A common electrode 150 is disposed on the wall 130 and the light-emitting layer 140. The common electrode 150, which is also called a cathode, provides electrons to the light-emitting layer 140. In one exemplary embodiment the common electrode 150 may be formed of a laminated calcium layer and a laminated aluminum layer.

Holes from the pixel unit 80 and 90 and electrons from the common electrode 150 are combined into excitons in the light-emitting layer 140, and the excitons generate light through their inactivation process.

In one exemplary embodiment at least one of a hole-injecting layer (not shown) and a hole-transferring layer (not shown) may be further disposed between the pixel unit 80 and 90 and the light-emitting layer 140. Also in another exemplary embodiment, at least one of an electron-injecting layer (not shown) and an electron-transferring layer (not shown) may be further disposed between the light-emitting layer 140 and the common electrode 150.

Also, in another exemplary embodiment the display device may further comprise a passivation layer (not shown) to protect the common electrode 150 and an encapsulation member (not shown) to prevent moisture or air from infiltrating into the light-emitting layer 140. The encapsulation member may comprise a sealing resin and a sealing can.

In the present exemplary embodiment, the transistors 40, 50, 60 and 70 are of a bottom-gate type, meaning that the gate electrode (41, 51, 61, 71) is disposed on the bottom of the transistor (40, 50, 60, 70). However, alternative exemplary embodiments include configurations wherein the transistors vary from the bottom-gate type, which will be discussed in more detail with reference to a second exemplary embodiment of the present invention.

Figure 4:
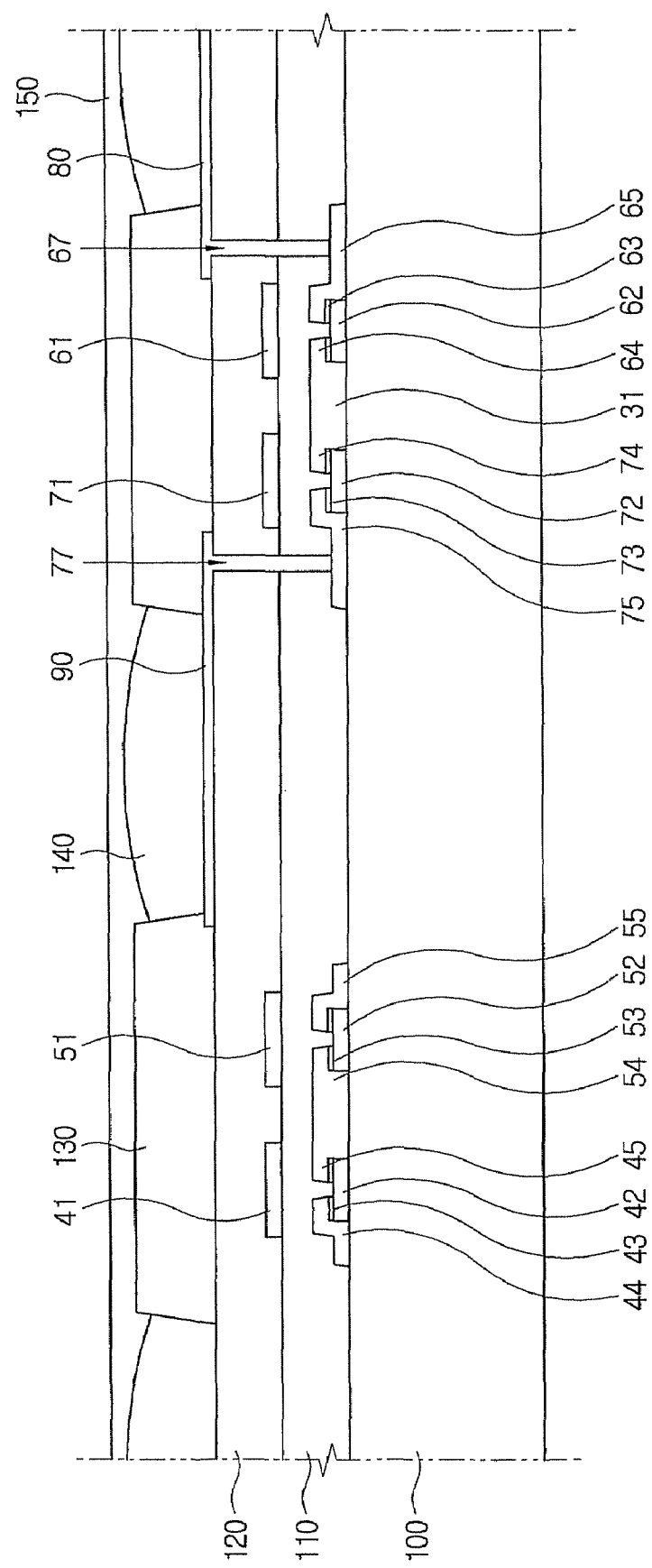
FIG. 4 is a cross-sectional view of a second exemplary embodiment of a display device according to the present invention.

FIG. 4 is a cross-sectional view of a second exemplary embodiment of a display device according to the present invention. In the second exemplary embodiment, transistors 40, 50, 60 and 70 are of a top-gate type, wherein the gate electrode (41, 51, 61, 71) is disposed above the transistor (40, 50, 60, 70). As shown in FIG. 4, gate electrodes 41, 51, 61 and 71 of the transistors 40, 50, 60 and 70 are disposed over semiconductor layers 42, 52, 62 and 72, source electrodes 45, 55, 65 and 75 and drain electrodes 44, 54, 64 and 74.

In manufacturing the second exemplary embodiment of a display device, first, an amorphous silicon layer and an n+ amorphous silicon layer are deposited on an insulating substrate 100. Then, the amorphous silicon layer and the n+ amorphous silicon layer are patterned and crystallized to form the semiconductor layers 42, 52, 62 and 72 and ohmic contact layers 43, 53, 63 and 73, which are made of polysilicon. Then, the source electrodes 45, 55, 65 and 75, the drain electrodes 44, 54, 64 and 74, a gate insulating layer 110 and the gate electrodes 41, 51, 61 and 71 are sequentially formed thereon.

In an alternative exemplary embodiment (not shown), the source electrodes 45, 55, 65 and 75 and the drain electrodes 44, 54, 64 and 74 of the transistors 40, 50, 60 and 70 may be disposed under the semiconductor layers 42, 52, 62 and 72. In this exemplary embodiment, a data metal layer and an n+ amorphous silicon layer are first formed on an insulating layer 100, and then patterned using a single mask so that the ohmic contact layers 43, 53, 63 and 73 may remain on the source electrodes 45, 55, 65 and 75 and the drain electrodes 44, 54, 64 and 74. Then, an amorphous silicon layer is deposited thereon and pattered and crystallized to form the semiconductor layers 42, 52, 62 and 72. In one exemplary embodiment a thin insulating layer is further formed on the amorphous silicon layer and then patterned and crystallized while forming the semiconductor layers 42, 52, 62 and 72.

Figure 5:
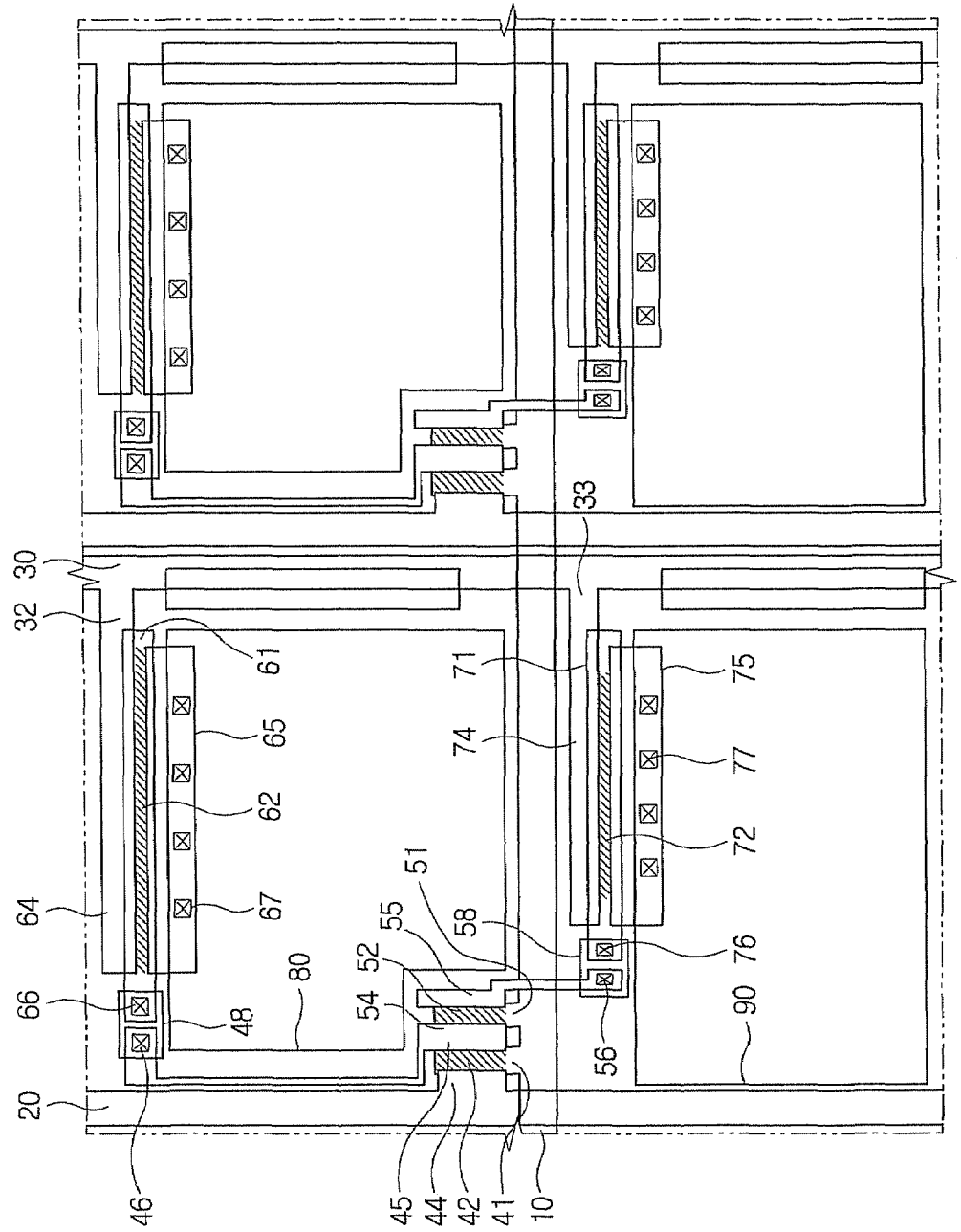
FIG. 5 is a top plan schematic view of a third exemplary embodiment of a display device according to the present invention.

FIG. 5 is a top plan schematic view of a third exemplary embodiment of a display device according to the present invention.

As shown in FIG. 5, a gate line 10 is disposed between a sub-pixel electrode 80 and a main pixel electrode 90. That is, the gate line 10 passes through the pixel, and the sub-pixel electrode 80 and the main pixel electrode 90 are disposed substantially opposite one another across the gate line 10. In one exemplary embodiment the gate line 10 passes through the middle of the pixel and the sub-pixel electrode 80 and the main pixel electrode 90 are disposed substantially symmetrically across the gate line 10. The third exemplary embodiment has substantially the same configuration as the first exemplary embodiment except for the configuration of the gate line 10.

In the third exemplary embodiment, a source electrode 45 of a first switching transistor 40 extends along a pixel, as in the first exemplary embodiment. However, a source electrode 55 of a second switching transistor 50 transverses the gate line 10 to be connected to the main pixel electrode 90 as opposed to the first exemplary embodiment. Thus, the source electrode 55 of the second switching transistor 50 need not extend a long distance in order to be connected to the main pixel electrode 90 and to be formed adjacent to the source electrode 45 of the first switching transistor 40. The shorter extension of the source electrode 55 of the second switching transistor 50 allows a metal layer to be patterned relatively easier.

Power supply electrodes 32 and 33 forming a drain electrode 64 of a first driving transistor 60 and a drain electrode 74 of a second driving transistor 70 extend from a power supply line 30.

The transistors 40, 50, 60 and 70 shown in FIGS. 2 and 5 may be arranged variously depending on the margins of a manufacturing process or a design for metal wiring.

Figure 6:
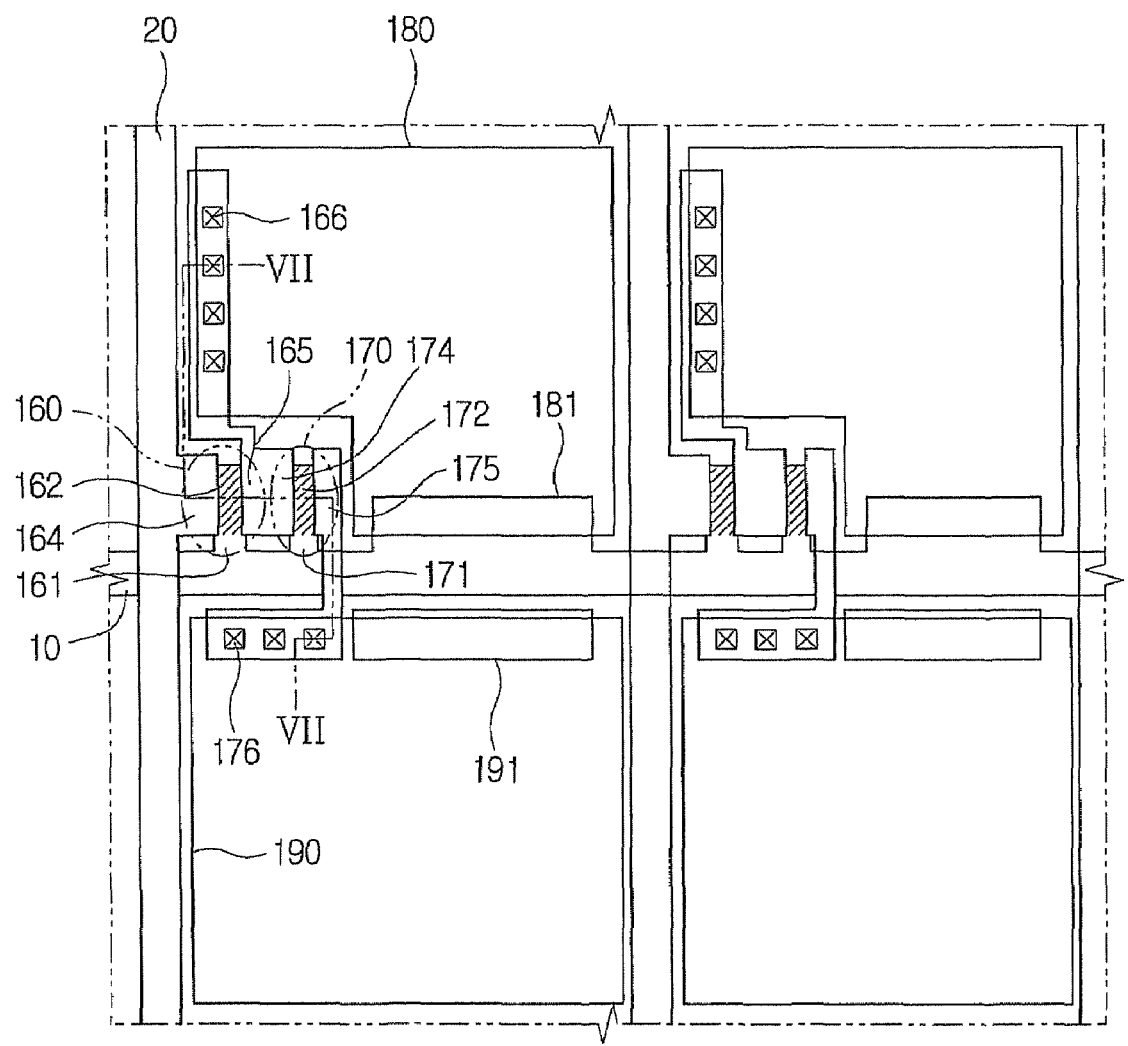
FIG. 6 is a top plan schematic view of a fourth exemplary embodiment of a display device according to the present invention.
Figure 7:
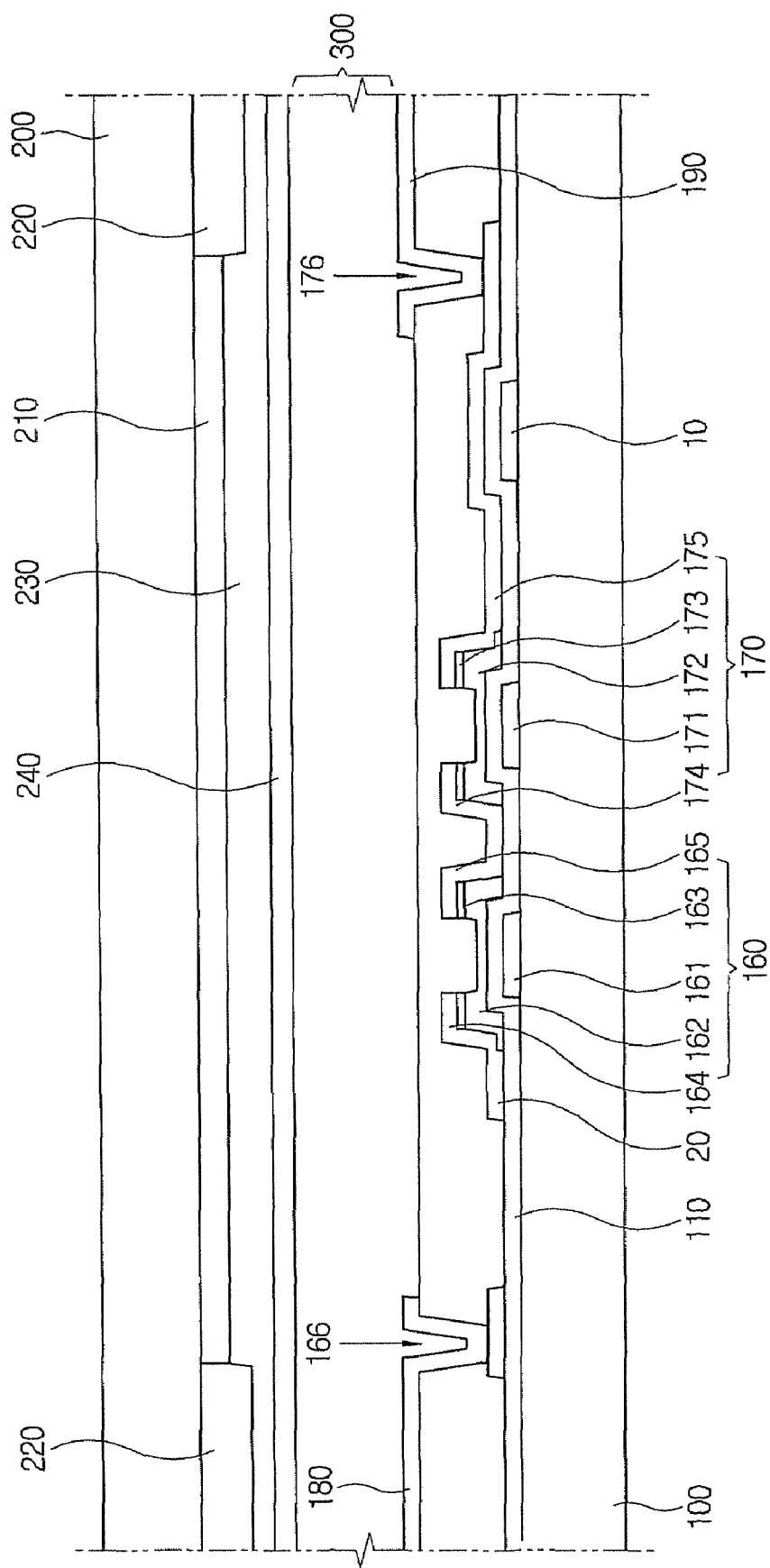
FIG. 7 is a cross-sectional view of the fourth exemplary embodiment of a display device according to the present invention.

FIG. 6 is a top plan schematic view of a fourth exemplary embodiment of a display device according to the present invention, and FIG. 7 is a cross-sectional view of the fourth exemplary embodiment of a display device according to the present invention.

In the fourth exemplary embodiment, a liquid crystal display ("LCD") will be described as an exemplary embodiment of a display device. The LCD comprises a first insulating substrate 100 where TFTs 160 and 170 are formed and a second insulating substrate 200 where color filters 220 are formed. A liquid crystal layer 300 is formed between the first insulating substrate 100 and the second insulating substrate 200.

As shown in FIG. 6, a single pixel comprises a sub-pixel electrode 180 and a main pixel electrode 190, which are connected to a first TFT 160 and a second TFT 170 through contact holes 166 and 167, respectively. The first TFT 160 and the second TFT 170 include components such as gate electrodes 161 and 171, semiconductor layers 162 and 172, ohmic contacts 163 and 173, drain electrodes 164 and 174, and source electrodes 165 and 175.

The first TFT 160 and the second TFT 170 are connected in series to a data line 20. A data voltage applied from the data line 20 is charged in the sub-pixel electrode 180 through the first TFT 160 and then charged in the main pixel electrode 190 through the second TFT 170. Since the data voltage is directly charged in the sub-pixel electrode 180, the sub-pixel electrode 180 may be influenced by a leakage current when a gate line is turned off, but the main pixel electrode 190 is less influenced by the leakage current. Thus, the main pixel electrode 190 where a majority of light is emitted maintains a relatively stable light-emitting state.

In the fourth exemplary embodiment, the semiconductor layers 162 and 172 are made of amorphous silicon, and the TFTs 160 and 170 are of a bottom-gate type. When the semiconductor layers 162 and 172 are made of amorphous silicon, a leakage current may be generated by light from a backlight unit (not shown). In one exemplary embodiment in order to prevent the leakage current from being generated, the TFTs 160 and 170 are of the bottom-gate type where the gate electrodes 161 and 171 block light from the backlight from reaching the semiconductor layers 162 and 172. In such an exemplary embodiment the first and second TFTs 160 and 170 may be formed by any of several methods known in the art.

A black matrix 210 is formed on the second insulating substrate 200. The black matrix 210 includes gaps wherein color filters 220 are disposed. In one exemplary embodiment the color filters have red, green and blue ("RGB") colors in another exemplary embodiment the color filters have cyan, magenta and yellow colors. The black matrix 210 prevents light from leaking between adjacent pixels and prevents light from reaching the TFTs 160 and 170, thereby preventing leakage current in the amorphous silicon TFTs. The prevention of leakage current in turn prevents image quality from being deteriorated.

The color filters 220 are repeatedly formed with red, green and blue colors or cyan, magenta and yellow colors in openings formed in the black matrix 210. The color filters 220 tint light passing through the liquid crystal layer 300 with color.

An overcoat layer 230 protects the color filters 220 and planarizes the second insulating substrate 200. In one exemplary embodiment the overcoat layer 230 is made of an acrylic epoxy material.

A common electrode 240, exemplary embodiments of which are made of ITO or IZO, directly applies a signal voltage to the liquid crystal layer 300 together with a pixel unit 80 and 90 of the first insulating substrate 100.

In one exemplary embodiment the semiconductor layers 162 and 172 may be made of polysilicon. In such an exemplary embodiment, the TFTs 160 and 170 may be of a top-gate type.

Figure 8:
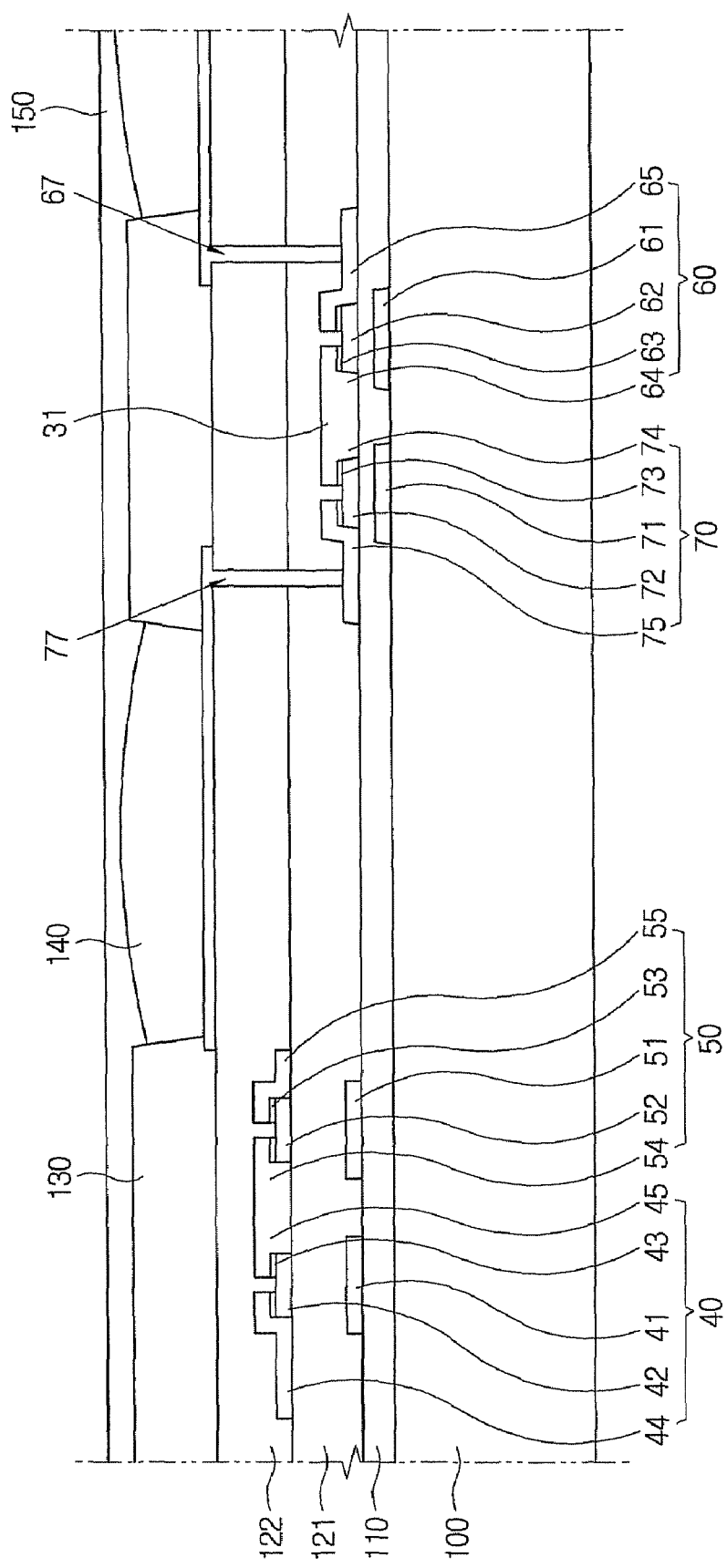
FIG. 8 is a cross-sectional view of a fifth exemplary embodiment of a display device according to the present invention.

FIG. 8 is a cross-sectional view of a fifth exemplary embodiment of a display device according to the present invention.

In the fifth exemplary embodiment, switching transistors 40 and 50 and driving transistors 60 and 70 are formed on different layers of the display device, respectively. Gate electrodes 41 and 51 of the switching transistors 40 and 50 are provided on the same layer as source electrodes 65 and 75 and drain electrodes 64 and 74 of the driving transistors 60 and 70. Semiconductor layers 42 and 52 of the switching transistors 40 and 50 are made of amorphous silicon, and semiconductor layers 62 and 72 of the driving transistors 60 and 70 are made of poly silicon or micro-silicon. That is, the switching transistors 40 and 50 and the driving transistors 60 and 70 are formed on the different layers from each other, and semiconductor layers thereof are made of different types of silicon.

Gate electrodes 61 and 71 of the driving transistors 60 and 70 are formed on an insulating substrate 100, and a gate insulating layer 110 covers the gate electrodes 61 and 71.

The semiconductor layers 62 and 72 are formed over the gate electrodes 61 and 71 of the driving transistors 60 and 70. The semiconductor layers 62 and 72 are made of polysilicon. Ohmic contact layers 63 and 73 are formed on the semiconductor layers 62 and 72 and are divided into two parts across the semiconductor layers 62 and 72.

The gate electrodes 41 and 51 of the switching transistors 40 and 50 and the source electrodes 65 and 75 and the drain electrodes 64 and 74 of the driving transistors 60 and 70 are provided on the gate insulating layer 110 and the ohmic contact layers 63 and 73, respectively. In one exemplary embodiment the electrodes 41, 51, 65, 75, 64 and 74 are formed by patterning the same metal layer.

A first insulating layer 121 is provided on the electrodes 41, 51, 65, 75, 64 and 74 and portions of the semiconductor layers 62 and 72 which are not covered by the electrodes 41, 51, 65, 75, 64 and 74.

The semiconductor layers 42 and 52 made of amorphous silicon are formed on the first insulating layer 121 corresponding to the gate electrodes 41 and 51 of the switching transistors 40 and 50.

Ohmic contact layers 43 and 53 are formed on the semiconductor layers 42 and 52. In one exemplary embodiment the ohmic contact layers 43 and 53 are made of n+ amorphous silicon highly doped with n type impurities.

Source electrodes 45 and 55 and drain electrode 46 and 56 of the switching transistors 40 and 50 are formed on the ohmic contact layers 43 and 53. In one exemplary embodiment the electrodes 45, 55, 46 and 56 are formed by patterning the same metal layer.

A second insulating layer 122 is provided on the electrodes 45, 55, 46 and 56 and portions of the semiconductor layers 42 and 52 which are not covered by the electrodes 45, 55, 46 and 56. Contact holes 67 and 77 are formed in the first insulating layer 121 and the second insulating layer 122 to expose the source electrodes 65 and 75 of the driving transistors 60 and 70.

The driving transistors 60 and 70 are electrically connected to a pixel unit 80 and 90 through the contact holes 67 and 77.

Figure 9:
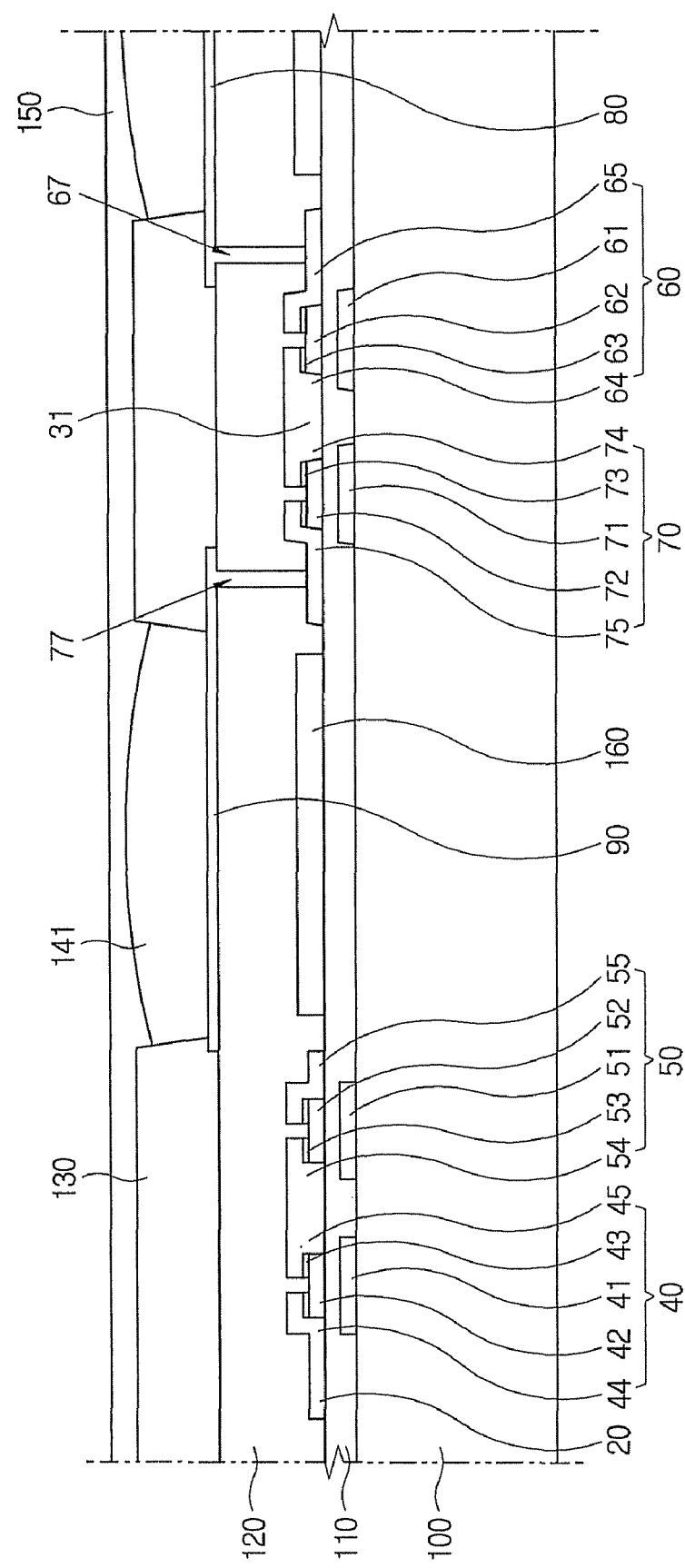
FIG. 9 is a cross-sectional view of a sixth exemplary embodiment of a display device according to the present invention.

FIG. 9 is a cross-sectional view of a fifth exemplary embodiment of a display device according to the present invention.

In the sixth exemplary embodiment, a display device further comprises a color filter layer 160 corresponding to a pixel unit 80 and 90. In this exemplary embodiment, a light-emitting layer 141 is made of an organic material from which white light, as opposed to colored light, is emitted.

The color filter layer 160 is periodically formed with red, green and blue colors or cyan, magenta and yellow colors in the pixel unit 80 and 90. This exemplary embodiment employs a bottom-emission type display in which light emitted from the light-emitting layer 141 passes through the color filter layer 160 disposed below the light-emitting layer 141. Alternative exemplary embodiments include configurations wherein the color filter layer 160 may be formed over the light-emitting layer 141. In such an exemplary embodiment, the display device may employ a top-emission type wherein light is emitted upward from the insulating substrate 100.

As apparent from the above description, the present invention provides a display device in which leakage current decreases to prevent cross-talk.

In addition, the present invention provides a display device with a reduced pixel defect rate.

Although a few exemplary embodiments of the present invention have been shown and described, it will be appreciated by those skilled in the art that changes may be made in these exemplary embodiments without departing from the principles and spirit of the present invention, the scope of which is defined in the appended claims and their equivalents.

What is claimed is:

1. A display device comprising:
   a first switching transistor;
   a first driving transistor connected to the first switching transistor;
   a second switching transistor including an input terminal connected to an output terminal of the first switching transistor;
   a second driving transistor connected to the second switching transistor; and
   a pixel unit comprising a sub-pixel electrode connected to the first driving transistor and a main pixel electrode separated from the sub-pixel electrode and connected to the second driving transistor,
   wherein the output terminal of the first switching transistor is connected to the control terminal of the first driving transistor, and the output terminal of the second switching transistor is connected to the control terminal of the second driving transistor.

2. The display device according to claim 1, further comprising a sub-storage electrode which maintains a voltage applied to the sub-pixel electrode and a main storage electrode which maintains a voltage applied to the main pixel electrode.

3. The display device according to claim 2, wherein a capacitance of the sub-storage electrode differs from a capacitance of the main storage electrode.

4. The display device according to claim 3, wherein the capacitance of the sub-storage electrode is greater than the capacitance of the main storage electrode.

5. The display device according to claim 2, wherein the area of the sub-pixel electrode differs from the area of the main pixel electrode.

6. The display device according to claim 2, wherein the area of the sub-pixel electrode is smaller than the area of the main pixel electrode.

7. The display device according to claim 6, further comprising a light-emitting layer formed on the sub-pixel electrode and the main pixel electrode, wherein the light-emitting layer emits light of a single color.

8. The display device according to claim 7, wherein the pixel unit comprises a plurality of pixel units and an area of each the plurality of pixel units are different.

9. The display device according to claim 8, further comprising:
   a power supply line which applies a driving voltage to the first and second driving transistors; and
   a power supply electrode branching from the power supply line,
   wherein the power supply electrode includes a first portion connected to the input terminal of the first driving transistor and a second portion connected to the input terminal of the second driving transistor.

10. The display device according to claim 7, wherein the sub-pixel electrode is disposed substantially opposite to the main pixel electrode with respect to a gate line.

11. The display device according to claim 10, wherein the switching transistors comprise semiconductor layers comprising one of amorphous silicon, microsilicon and polysilicon and the driving transistors comprise semiconductor layers comprising one of amorphous silicon, microsilicon and polysilicon.

12. The display device according to claim 10, wherein the switching transistors comprise semiconductor layers comprising amorphous silicon, and the driving transistors comprise semiconductor layers comprising one of microsilicon and polysilicon.

13. The display device according to claim 12, wherein semiconductor layers of the switching transistors and the driving transistors comprise polysilicon, and the switching transistors and the driving transistors are top-gate type transistors.

14. The display device according to claim 13, further comprising a color filter layer corresponding to the pixel unit.

15. The display device according to claim 14, wherein semiconductor layers of the first and second switching transistors are disposed further from an insulating substrate than semiconductor layers of the first and second driving transistors.

16. A display device comprising:
   a data line;
   a first switching transistor and a second switching transistor connected to the data line in series;
   a first driving transistor connected to the first switching transistor;
   a second driving transistor connected to the second switching transistor;
   a first sub-pixel connected to the first driving transistor; and a second sub-pixel separated from the first sub-pixel and connected to the second driving transistor, wherein the output terminal of the first switching transistor is connected to the control terminal of the first driving transistor, and the output terminal of the second switching transistor is connected to the control terminal of the second driving transistor.

17. The display device according to claim 16, wherein the first and the second driving transistors comprise semiconductor layers comprising polysilicon.

18. The display device according to claim 16, wherein the first and second switching transistors comprise semiconductor layers comprising amorphous silicon.

19. A method of manufacturing a display device comprising:

forming a first switching transistor;

forming a first driving transistor connected to the first switching transistor;

forming a second switching transistor including an input terminal connected to an output terminal of the first switching transistor;

forming a second driving transistor connected to the second switching transistor; and forming a pixel unit comprising a sub-pixel electrode connected to the first driving transistor and a main pixel electrode separated from the sub-pixel electrode and connected to the second driving transistor.

wherein the output terminal of the first switching transistor is connected to the control terminal of the first driving transistor, and the output terminal of the second switching transistor is connected to the control terminal of the second driving transistor.

* * * * *